(12) United States Patent
Alsmeier et al.

(10) Patent No.: US 6,593,613 B1
(45) Date of Patent: Jul. 15, 2003

(54) MEMORY CELL FOR PLATELINE SENSING

(75) Inventors: Johann Alsmeier, Radebeul (DE); Ulrike Gruening, Munich (DE); Gerhard Mueller, Wappingers Falls, NY (US); Young-Jin Park, Poughkeepsie, NY (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/525,093

(22) Filed: Mar. 14, 2000

Related U.S. Application Data

(63) Continuation-in-part of application No. 09/323,363, filed on Jun. 1, 1999, now Pat. No. 6,201,730.

(51) Int. Cl.[7] ............................................. H01L 27/108
(52) U.S. Cl. ...................................... 257/306; 257/296
(58) Field of Search .................................... 257/296, 301, 257/302, 303, 304, 305, 306, 307, 308, 309, 311

(56) References Cited

U.S. PATENT DOCUMENTS

| | | | |
|---|---|---|---|
| 5,032,882 A | * | 7/1991 | Okumura et al. |
| 5,381,364 A | | 1/1995 | Chern et al. ................. 365/145 |
| 5,400,275 A | | 3/1995 | Abe et al. .................... 365/145 |
| 5,447,882 A | * | 9/1995 | Kim |
| 5,541,872 A | | 7/1996 | Lowrey et al. ............. 365/145 |
| 5,598,366 A | | 1/1997 | Kraus et al. ................. 365/145 |
| 5,817,552 A | * | 10/1998 | Roesner et al. |
| 5,874,760 A | * | 2/1999 | Burns, Jr. et al. |
| 5,991,188 A | | 11/1999 | Chung et al. ................ 365/145 |

OTHER PUBLICATIONS

Streetman, "Solid State Electronic Devices," 1990, Prentice–Hall, 3rd edition, p. 339–341.*

* cited by examiner

*Primary Examiner*—Nathan J. Flynn
*Assistant Examiner*—Kevin Quinto
(74) *Attorney, Agent, or Firm*—Stanton Braden

(57) ABSTRACT

Sensing of information from a memory cell via a plateline is disclosed. The memory cell comprises a bitline coupled to a junction of a cell transistor while the other junction is coupled to an electrode of the capacitor. The bitline is coupled to a constant voltage source. A plateline is coupled to the other capacitor electrode.

29 Claims, 10 Drawing Sheets

MEMORY CELL FOR PLATELINE SENSING

This is a continuation-in-part of U.S. patent application U.S. Ser. No. 09/323,363, filed Jun. 1, 1999, now U.S. Pat. No. 6,201,730, titled "PLATELINE SENSING," which is herein incorporated by reference for all purposes.

FIELD OF THE INVENTION

The present invention relates generally to integrated circuits. In particular, the invention relates to sensing of memory cells via a plateline.

BACKGROUND OF THE INVENTION

Referring to FIG. 1, a conventional dynamic random access memory cell 101 is shown. As shown, the memory cell comprises a cell transistor 110 and a cell capacitor 150. A first junction 111 of the transistor is coupled to the bitline 125, and a second junction 112 is coupled to the capacitor. A gate electrode 113 of the transistor is coupled to the wordline 126.

The capacitor comprises a first electrode 153 and a second electrode 157 separated by a dielectric layer 159. The first electrode 153 of the cell capacitor is coupled to the second junction of the transistor. The first electrode serves as a storage node for storing information and is typically referred to as a storage node electrode. The second electrode can be coupled to a constant voltage source 180 and is usually referred to as a plate electrode.

A plurality of cells is arranged in rows and columns to form a cell array, connected by wordlines in the row direction and bitlines in the column direction. The second or plate electrode of the cell capacitor typically serves as a common plate for the cells in the array.

The bitlines of the array are coupled to sense amplifiers to facilitate memory accesses. Each sense amplifier is coupled to a pair of bitlines. The bitline of the bitline pair containing the selected memory cell is referred to as the bitline true and the other is referred to as the bitline complement.

The memory cell is accessed by activating the wordline to render the transistor conductive, connecting the bitline to the storage node. For a read operation, information stored in the memory cell is passed through to the bitline. The charge from the memory cell produces a voltage differential on the bitline pair. The sense amplifier senses the differential voltage and amplifies it, producing a signal representing the information stored in the cell. In a write operation, the sense amplifier charges the bitline true to a voltage level that represents the information that is to be stored in the cell.

FIG. 2 is a timing diagram 201 showing the operation of a conventional memory cell. The plate electrode (PE), the bitline true (BL), the wordline (WL), and the storage node (SN) signals are shown. As shown, the plate electrode of the cell capacitor is connected to a constant voltage source $V_{pe}$ which, for example, is about $V_{blh}/2$, where $V_{blh}$ is equal the bitline high level. For a write operation 270, BL is charged to a voltage level equal to the information that is to be written into the cell. Activating the wordline, as indicated by $WL=V_{pp}$, connects the storage node to the bitline. After the data is written into the cell, the wordline is deactivated (e.g., WL=0) to isolate or float the storage node.

In preparation of a read operation 260 or a memory access, an equalization circuit equalizes the bitline pair to a voltage level of $V_{bleq}$. $V_{bleq}$, for example, is equal to about $V_{blh}/2$. Other values such as $V_{DD}/2$ are also useful. The wordline is activated to commence the read operation. Activating the wordline connects the storage node to the bitline. Depending on the value stored, the bitline is pulled high or low slightly to create a negative or positive differential voltage between on the bitline pair.

The read operation discharges the storage node to about $V_{bleq}$. To restore the information back into the memory cell, a restore operation 290 is performed after the read operation.

As described, the conventional DRAM IC senses information stored in the storage node of a cell capacitor through the junction of the cell transistor. Such a memory cell sensing scheme requires a contact between the bitline and a junction of the cell transistor. This requirement makes it difficult for cell designs having a cell area of, for example, less than $6F^2$ (where F is the minimum feature size) to accommodate the bitline contact, especially if the cell capacitor is a stack capacitor.

As evidenced from the foregoing discussion, it is desirable to provide an improved sensing scheme that facilitates smaller cell sizes.

SUMMARY OF THE INVENTION

The invention relates to sensing information from a memory cell. In accordance with the invention, sensing information from a memory cell is achieved via a plateline. The memory cell comprises a transistor coupled to a capacitor is employed. The bitline is coupled to one of the junctions of the transistor while the wordline is coupled to the gate. In one embodiment, a plateline is provided. The plateline is coupled to the capacitor and to a sense amplifier, enabling information to be sensed directly from the capacitor.

DETAILED DESCRIPTION OF THE INVENTION

The invention relates to a sensing scheme for memory cells. The sensing scheme can be employed in semiconductor integrated circuits (ICs) such as, for example, random access memories (RAMs) including dynamic RAMs (DRAMs), high speed DRAMs such as Rambus DRAMs and Sync-Link DRAMs (SLDRAMs), ferroelectric RAMs (FRAMs), synchronous DRAMs (SDRAMs), merged DRAM-logic chips (embedded DRAMs), or other types of memory ICs or logic ICs.

In accordance with the invention, the sensing scheme employs a plateline to transfer information to and from a memory cell. Sensing information through a plateline is contrary to conventional sensing schemes which sense information through a bitline.

The use of plateline sensing provides several advantages. One advantage derived from plateline sensing is the flexibility afforded to designers in designing the bitlines. For example, the bitlines of the memory array can be connected together to form a common bitline or have various orientations with respect to the wordlines (e.g., parallel, diagonal, or perpendicular). The bitlines of the array can comprise of a conductive plate to which all the memory cells are connected to form a common bitline. The conductive plate can comprise metal, doped polysilicon, or other conductive materials. The flexibility in designing bitlines facilitates smaller cell sizes, such as $6F^2$ or below.

Alternatively, the bitlines can be formed in the substrate. For example, dopants can be implanted to form heavily doped regions or wells in the silicon substrate to create buried bitlines which are located beneath the array transistors. The wells can be shaped as stripes or lines for connecting a plurality of cells. The stripes can have various orientations with respect to the wordline. The stripes are, for example, coupled together to form a common bitline. Also, a common well can be used to serve as the common bitline. Buried bitlines are advantageous as their use enables an increase in the surface area on which a capacitor (e.g. a stack capacitor) can be formed as well as providing a more planar surface for forming the capacitor, leading to improved process windows and better yields.

Figure 1:
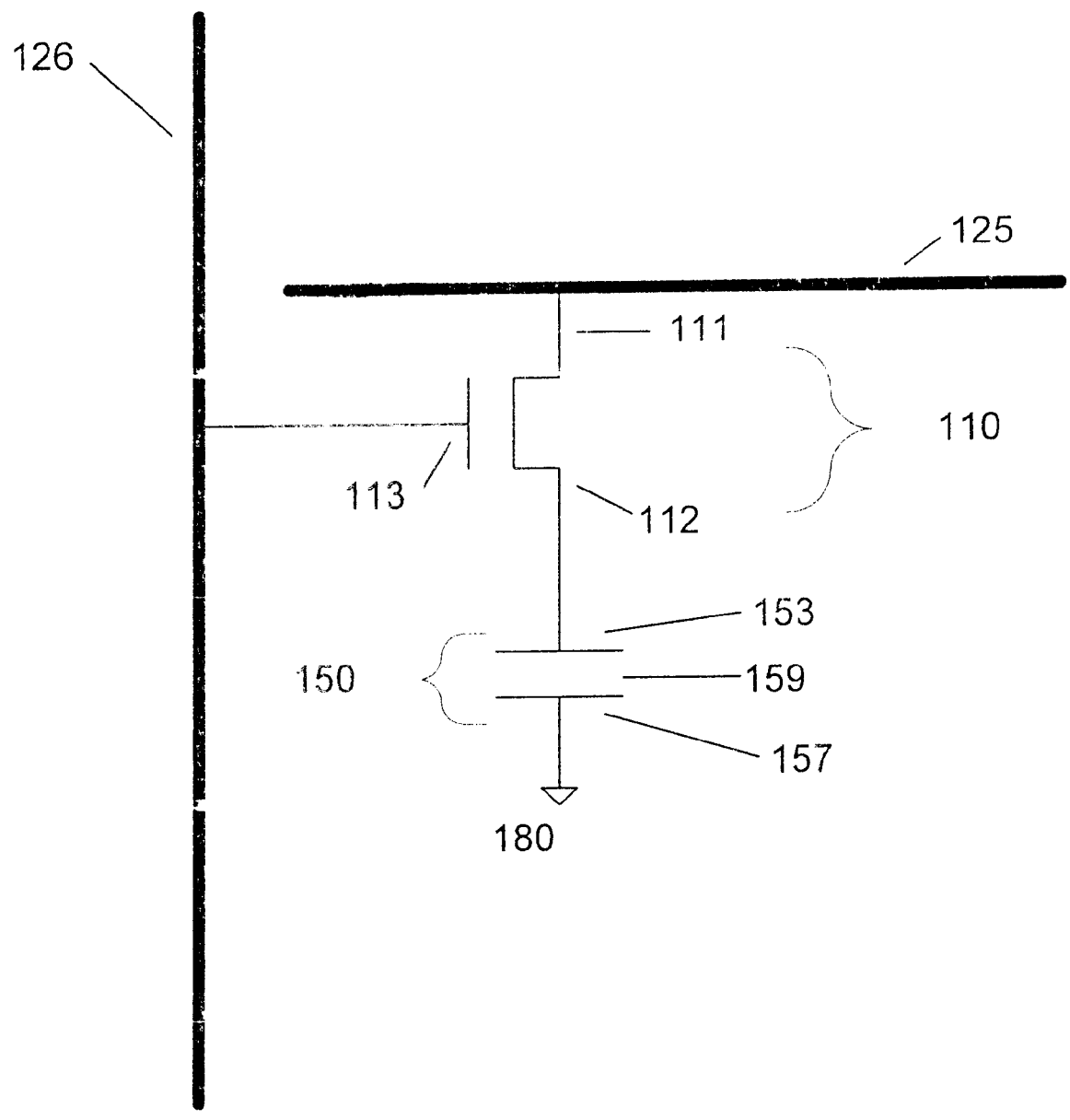
FIG. 1 shows a conventional memory cell.
Figure 2:
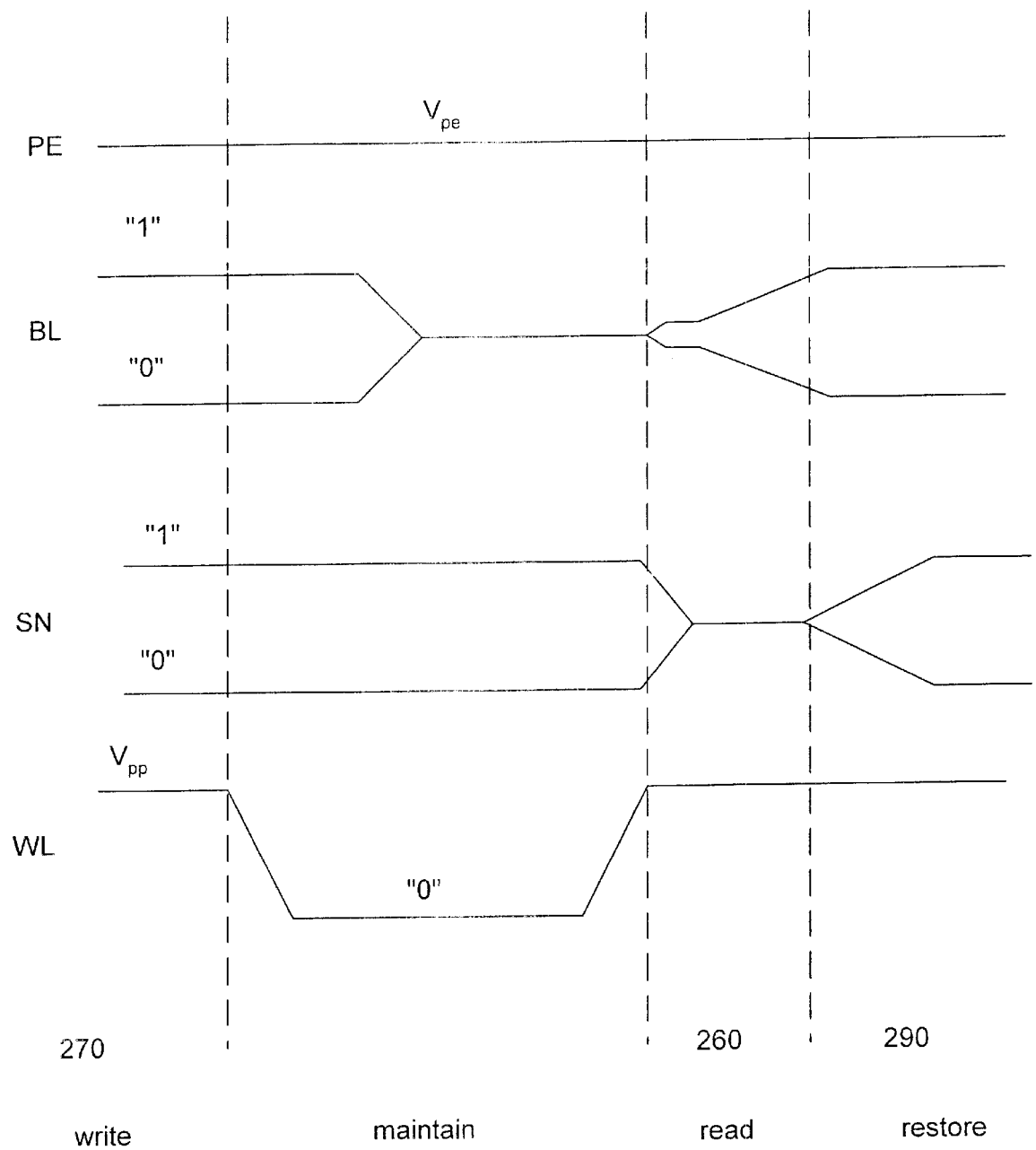
FIG. 2 shows a timing diagram of the operation of a conventional memory cell.
Figure 3A:
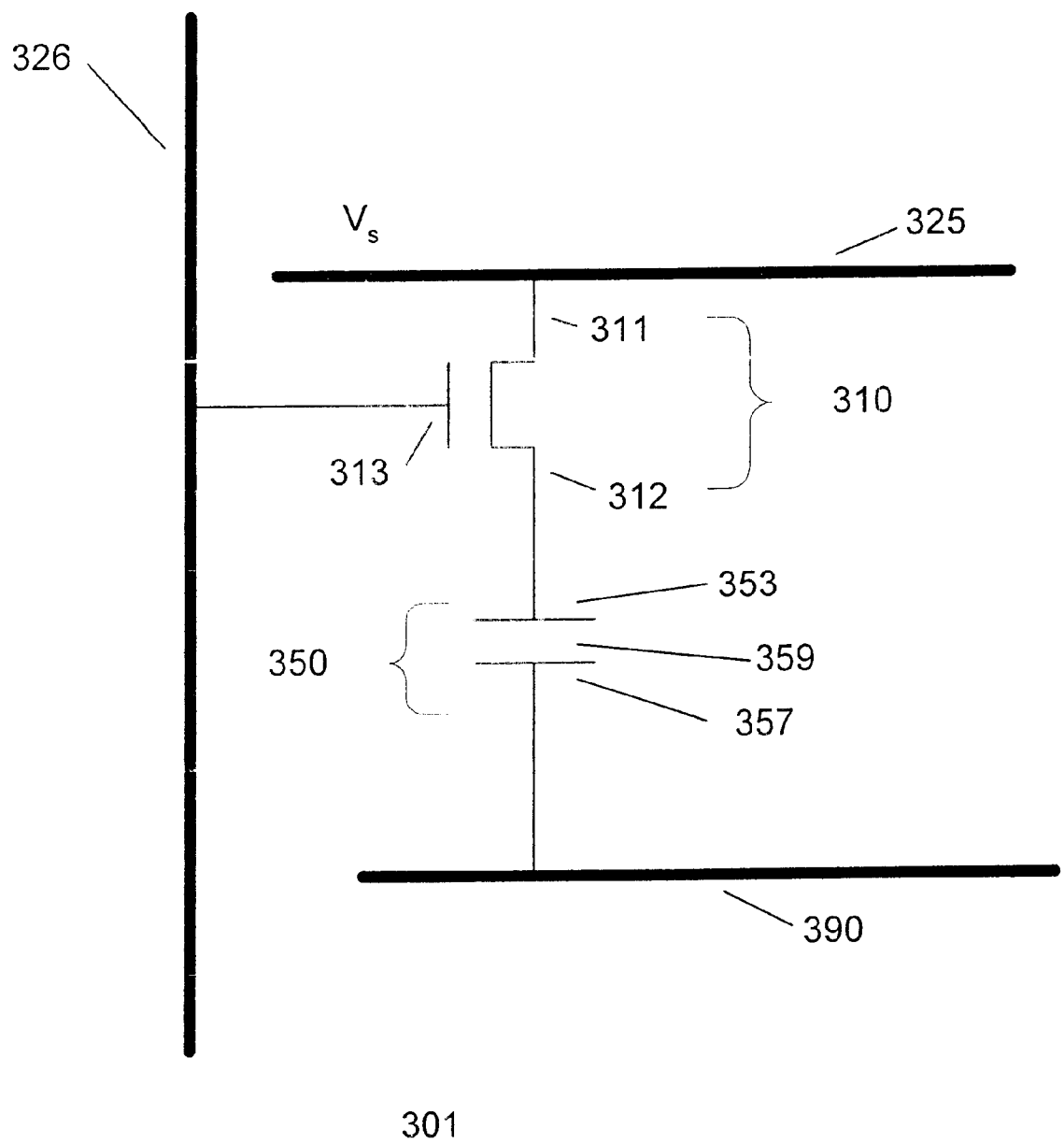
FIGS. 3a–b show embodiments of memory cells in accordance with the invention.

FIG. 3a shows a memory cell 301 in accordance with one embodiment of the invention. As shown, the memory cell comprises an access transistor 310 and a cell capacitor 350. The access transistor comprises, for example, a field effect transistor (FET), such as a p-type FET (pFET) or an n-type FET (nFET). The FET can be implemented as a vertical cell transistor. Vertical cell transistors are described in, for example, W. F. Richardson, et. al., "A trench transistor cross-point DRAM cell," 1985 IEDM Tech. Digest, p.714–717 (1985); and K. Sunouchi, et. al., "A surrounding gate transistor (SGT) cell for 64/256 Mbit DRAM," 1989 IEDM Tech. Digest, p. 23–26 (1989), which are herein incorporated by reference for all purposes. The use of planar transistors or other type of transistors is also useful.

A first junction 311 of the transistor is coupled to the bitline 325. The bitline is coupled to a voltage source. The voltage source is, for example, equal to $V_s$. The bitline, in accordance with one embodiment of the invention, serves as a common bitline for the cells in the memory array. The bitline can be formed from, for example, metal, doped polysilicon, or highly doped silicon. A gate electrode 313 of the transistor is coupled to the wordline 326.

Figure 3B:
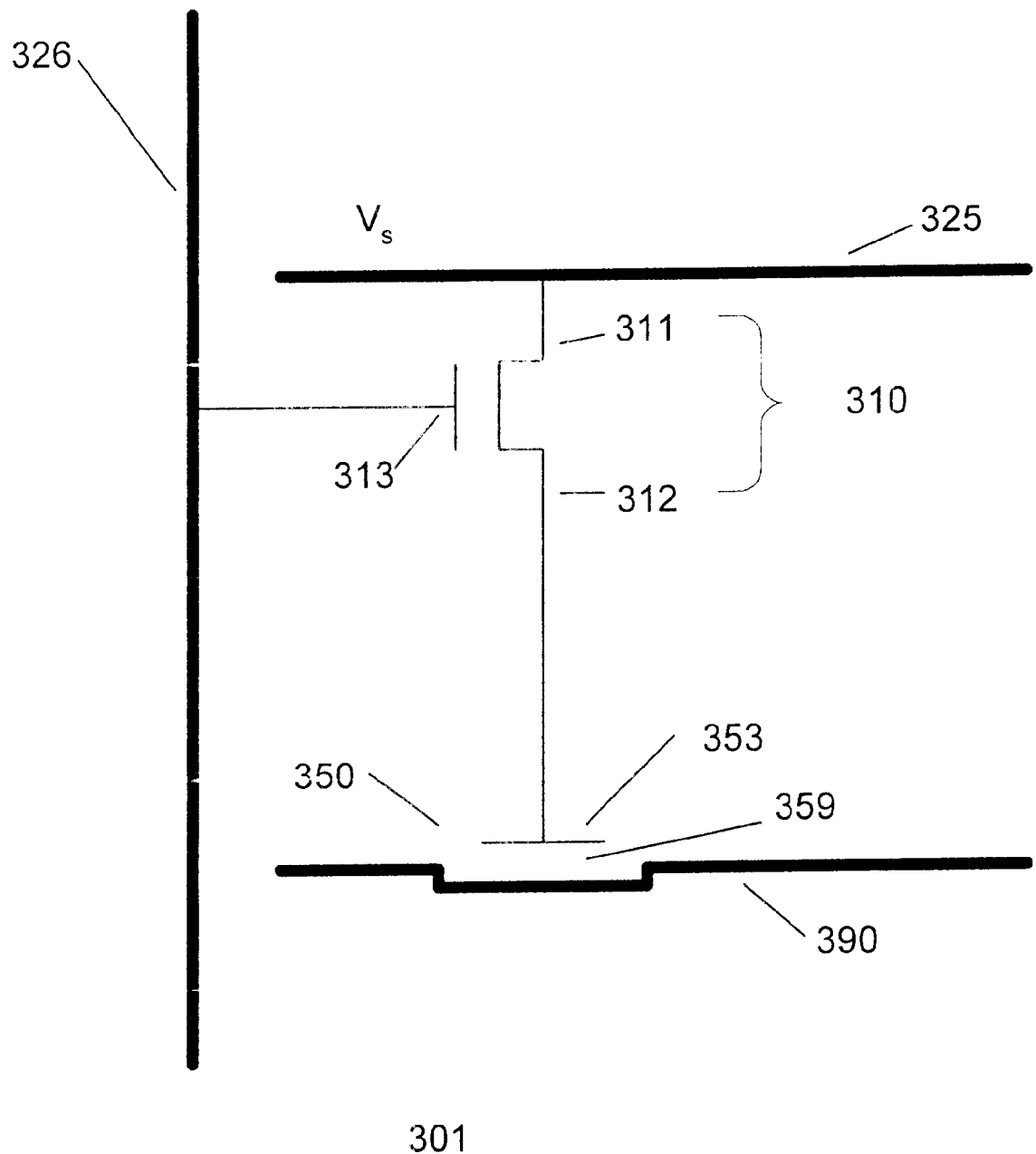

The capacitor comprises first and second cell capacitor electrodes 353 and 357 separated by a dielectric layer 359. The capacitor comprises, in one embodiment, a stack capacitor. The stack capacitor, includes, for example, a simple stacked capacitor. Other stack capacitors, such as cylindrical capacitors, capacitors which employ hemispherical grains (HSG), or capacitors which comprises high epsilon dielectrics, are also useful. Other types of capacitors such as trench capacitors and/or multi-bit capacitors are also useful. Multi-cell capacitors are described in, for example, Takashi Okuda et. al., "A four-level storage 4-Gb DRAM," IEEE J. of Solid-State Circuits, vol. 32, No. 11, Nov. p.1743–1747 (1997), which is herein incorporated by reference for all purposes. The first cell capacitor electrode 353 is coupled to the second junction of the access transistor, and the second cell capacitor electrode is coupled to a plateline 390. Providing a second cell electrode that forms a plateline 390, as shown in FIG. 3b, is also useful.

A plurality of cells is arranged in rows and columns, connected by wordlines in the row direction and platelines in the column direction. Typically, the wordlines are perpendicular to the platelines. Providing platelines which are not perpendicular to the wordlines (e.g. diagonal to the wordlines) is also useful.

In one embodiment, the platelines are coupled to sense amplifiers. The sense amplifiers, for example, can comprise conventional sense amplifiers used in memory ICs. Sense amplifiers, such as those described in co-pending U.S. patent application U.S. Ser. No. 09/225,665, titled "Improved Sense Amplifier", which is herein incorporated by reference for all purposes, can also be employed. A sense amplifier is coupled to a pair of platelines. The plateline of the plateline pair containing the selected memory cell is referred to as the plateline true and the other is referred to as the plateline complement.

Generally, a memory cell is accessed by activating the wordline connected thereto. During a write operation, the plateline true is charged to a voltage level which depends on the information that is to be written. The plateline voltage affects the voltage in the storage node after floating the storage node.

For a read operation, the plateline true voltage is affected by the information stored in the cell, causing a voltage differential in the plateline pair. Depending on the information in the storage node, the differential is either positive or negative. A sense amplifier senses and amplifies the voltage differential.

The charge stored in the storage node dissipates over time due to leakage, requiring a refresh operation to restore the information. One of the paths from which current leaks is through the access transistor. In accordance with one embodiment of the invention, the wordline in the inactive mode comprises a voltage potential (wordline low) which reduces the current leakage through the access transistor. For nFET access transistors, the wordline low comprises a voltage potential different from 0 V. In one embodiment, the wordline low comprises a negative voltage potential. The negative wordline low potential, for example, is about –0.1 to –1.0 V, preferably about –0.5 V. Other negative wordline low levels are also useful.

In another embodiment, the body of the access transistor is biased at a reference potential in order to increase its gate threshold voltage ($V_T$). In one embodiment, the array well in which the access transistors are located is biased to a reference potential to bias the body of the transistor. This increases the device design flexibility. Due to the resulting higher $V_T$, the leakage current through the channel of the access transistor is reduced. For example, the body of an nFET access transistor is biased at a negative potential, such as the negative wordline low, to increase its threshold voltage.

In one embodiment, the body of the transistor is dynamically biased. Biasing the body of the transistor can be achieved by biasing the array well in which the transistors are located. The body of the transistor is biased in the non-operating mode to increase its gate $V_T$ in order to reduce leakage and increase retention time. The body voltage of the access transistor is dynamically changed in the operating mode to reduce the gate $V_T$ in order to increase its current drivability. Thus, dynamically biasing the body of the transistor advantageously improves the device performance and reduces leakage current. Dynamically biasing the body of the transistor is particularly useful for low power and silicon-on-insulator (SOI) applications.

In the case of an nFET, the body of the transistor is biased at a negative potential in the non-operating mode to increase its $V_T$ and dynamically increased to reduced its $V_T$ in the operating mode. The body of the nFET is biased from, for example, about −0.5 V in the non-operating to about 0 V in the operating mode. For the case of a pFET, the polarities of the bias voltages are changed accordingly.

In one embodiment, the body of the transistor can be biased by biasing the well in substrate which the transistor is located. Alternatively, the body of the transistor can be floating. In such an application, the body of the transistor can be biased by coupling the body directly to the wordline or to the bias source. This is particularly useful for $6F^2$ or less cell designs.

In an alternative embodiment, the reference voltage coupled to the bitline is dynamically controlled to improve the operation of the described plateline sensing scheme.

Figure 4:
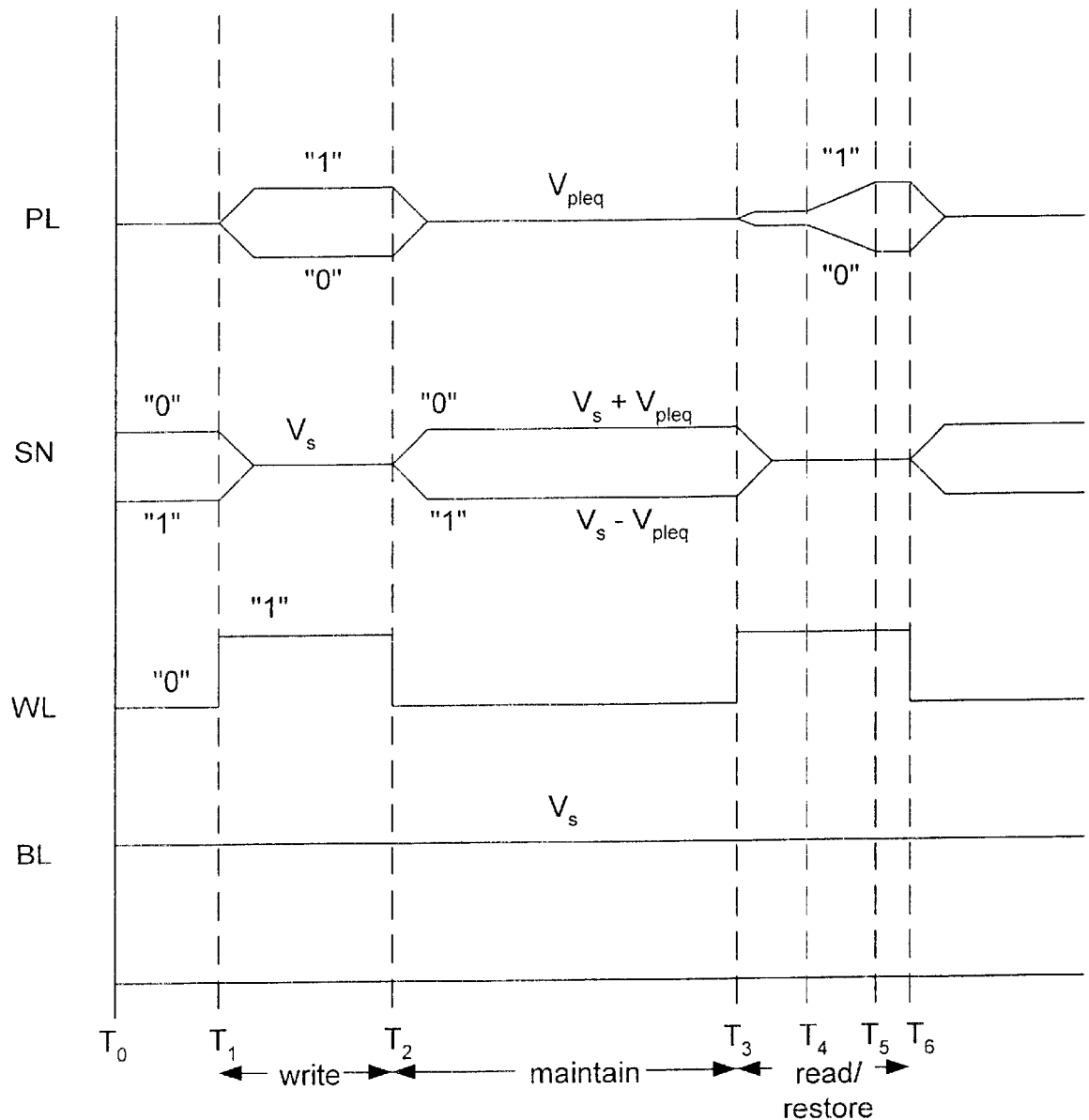
FIG. 4 shows a timing diagram of the operation of a memory cell in accordance with one embodiment of the invention.

FIG. 4 shows a timing diagram of the operations of the memory cell in accordance with one embodiment of the invention. The bitline (BL), the plateline (PL), the wordline (WL), and storage node (SN) signals are shown. The SN signal represents the data stored in the memory cell. BL is at a constant voltage level $V_s$. At time $t_0$, WL is inactive (indicated by logic 0). This isolates the storage node. PL is equalized to $V_{pleq}$ in preparation of a memory access.

At $t_1$, WL is activated (indicated by a logic 1) to commence a write operation. Activating WL couples the storage node to BL, causing SN to be precharged to the voltage potential of BL. PL is then charged to an appropriate voltage level, depending on the data that is to be written to the cell. For example, PL is charged to a high or logic 1 level (e.g., about 1–2.5V or about $2V_{pleq}$) to write a 1 or to a low or logic 0 level (e.g., about 0V) to write a 0.

At $t_2$, the WL is deactivated to isolate the storage node. In preparation of the next access, PL is equalized to $V_{pleq}$. Due to charge coupling between PL and SN, the voltage of SN is affected. If PL was at a logic 1 (e.g., $V_{pl}$ equal to about $2V_{pleq}$) during $t_1$–$t_2$, the coupling causes SN to swing down to a value of BL−$V_{pleq}$. If PL was at a logic 0 (about 0V) during $t_1$–$t_2$, then SN swings up to BL+$V_{pleq}$.

During $t_2$–$t_3$, the storage node is electrically isolated from the adjacent conductors since the WL is inactive. As a result, the charge on the cell capacitor is maintained.

At $t_3$, WL is activated to perform a read operation. The plateline is floating. Floating the plateline is achieved by isolating it from its equalizer circuitry of the sense amplifier using a plateline isolation circuit. Activating the WL electrically couples the storage node to the bitline, causing the storage node to have a voltage potential of the BL. At $t_4$, the charge coupling between the storage node and the plateline causes PL to be either pulled up or pulled down, depending on the information stored in the storage node. The pulling up or pulling down of PL creates a voltage differential in the plateline pair. For example, PL is pulled up above $V_{pleq}$ to produce a positive differential if SN is equal to a logic 1; PL is pulled down below $V_{pleq}$ to produce a negative differential if SN is equal to a logic 0. A sense amplifier senses the differential signal between the two platelines of a plateline pair and amplifies it during $t_4$–$t_5$, charging the plateline to logic 1 or logic 0, depending on the signal stored in storage node.

At $t_5$–$t_6$, the amplified signal can be transferred to other circuits. After completion of this read operation at $t_6$, WL is deactivated and the plateline equalizer is activated to charge PL to $V_{pleq}$. Since the storage node SN is isolated due to an inactive WL, the charge on the storage capacitor is maintained. Due to charge coupling between SN and PL, SN is restored to its original level prior to the read operation. As a result, the information in the cell is maintained.

Figure 5A:
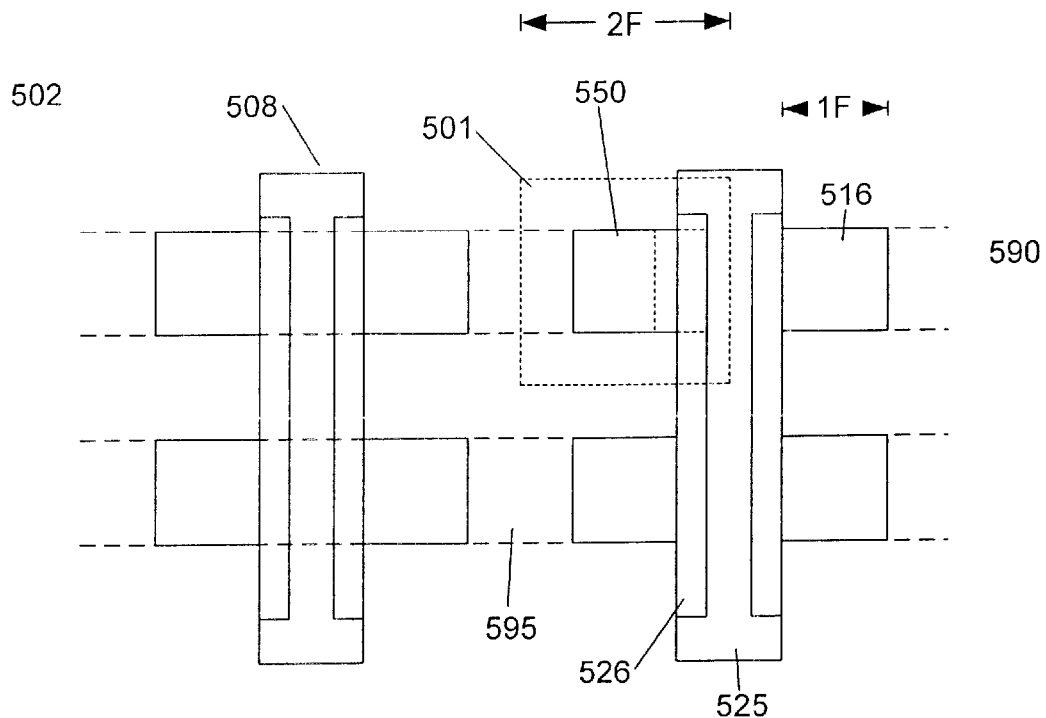
FIGS. 5a–b show a layout and cross-section of one embodiment of the invention.
Figure 5B:
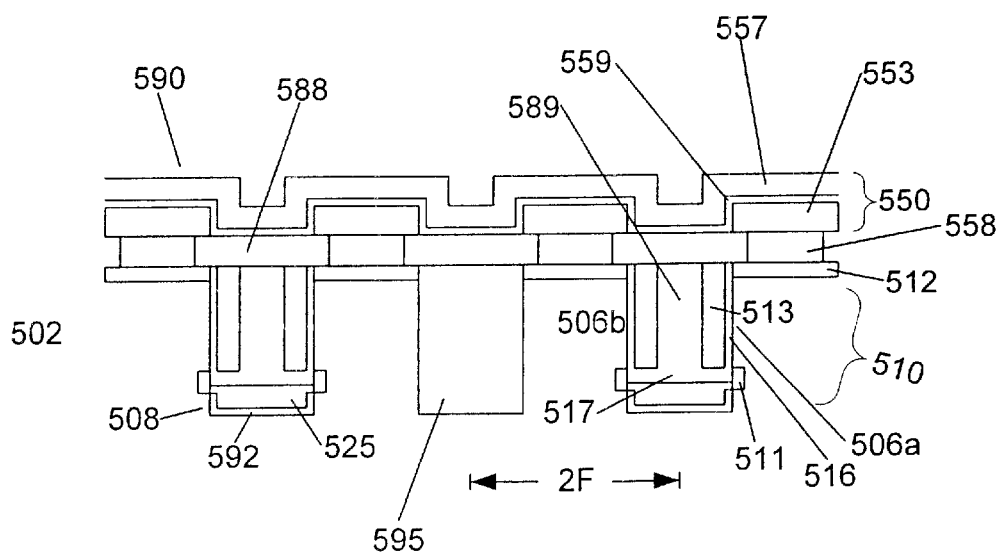

FIGS. 5a–b show a cell layout and its corresponding cross-section in accordance with one embodiment of the invention. Referring to the 5a, bitlines 525 and wordlines 526 of the array are parallel to each other while platelines 590 (depicted by the heavy dotted lines) intersect the bitlines and wordlines. In one embodiment, the platelines are perpendicular to the wordlines. Providing platelines which are not perpendicular to the wordlines is also useful. In one embodiment, the wordlines and bitlines are located in trenches 508 formed in a substrate 502.

Memory cells 501 are located at regions where the wordlines and platelines intersect. In accordance with one embodiment of the invention, a memory cell occupies an area equal to about $4F^2$, where F is the minimum feature size. A cell active area 516 of about $1F^2$ is defined on the surface of the substrate. The memory cell includes a vertical transistor 510 coupled to a capacitor 550. Separating the memory cells are isolation regions 595.

Referring to FIG. 5b, a plurality of trenches 508 are formed in the substrate. A trench comprises a buried bitline 525 located at the bottom thereof. In one embodiment, an isolation collar 592 is provided. The isolation collar lines the lower portion of the trench. The isolation collar advantageously reduces junction capacitance for embodiments with doped poly bitlines by preventing junction formation.

A vertical transistor 510 is located in the trench above the bitline. The vertical transistor comprises a gate 513 and first and second diffusion regions 511 and 512. The gate is located along a sidewall 506a of the trench, forming a channel in the vertical direction. The gate is insulated from the bitline by a dielectric layer 517. A gate oxide layer 516 separates the gate from the sidewall. The first diffusion region couples the transistor to the bitline and the second diffusion region is on the substrate surface in a plane perpendicular to the gate. The capacitor 550 is coupled to the second diffusion region via a contact 558. The capacitor comprises first and second electrodes 553 and 557 separated by dielectric layer 559. In one embodiment, the top or second electrode 557 serves as a plateline 590 of the array. Providing a non-integrated second plate and plateline is also useful.

A dielectric layer 588 is provided above the trench to insulate the plateline from the gate of the transistor. In one embodiment, another gate conductor is provided along the other trench sidewall 506b, forming a transistor for another memory cell. The gate conductors are electrically isolated from each other by an insulating layer 589. Isolation regions 595 are provided to electrically isolate memory cells. In one embodiment, isolation regions comprise shallow trench isolation (STI) regions. Other types of isolation regions, such as LOCOS, are also useful.

Figure 6A:
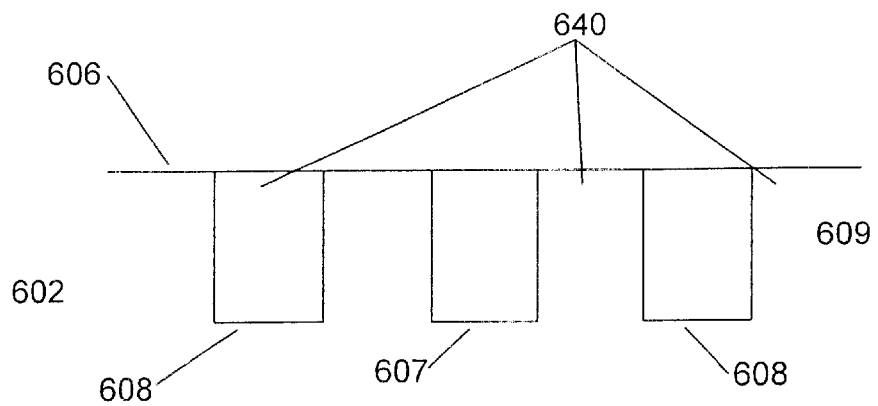
FIGS. 6a–l show a process for fabricating a memory cell in accordance with one embodiment of the invention 1.

FIGS. 6a–l show a process for forming the memory cell in accordance with one embodiment of the invention. Referring to FIG. 6a, a substrate 602 is provided. The substrate can be, for example, any semiconductor substrate, such as silicon. Other types of semiconductor substrates, such as silicon-on-insulator, are also useful. The substrate can be prepared to include a doped well 609 comprising, for example, p-type dopants. The doped well serves to prevent punch through for n-type transistors. An n-type doped well can be provided for p-type transistors.

The substrate includes trenches 607 and 608 etched therein. In one embodiment, the trenches are provided for STI regions and buried bitlines. The trenches are etched using conventional patterning techniques. Such techniques employ a patterned hard mask comprising, for example, nitride on the surface of the substrate. The hard mask exposes portions of the substrate corresponding to the trenches. An etch, such as a reactive ion etch (RIE), removes portions of the substrate to form the trenches. Oxide is deposited on substrate to fill the trenches. Various techniques, such as chemical vapor deposition (CVD) can be used to deposit the oxide. The substrate surface is planarized to remove excess oxide and the nitride mask, leaving a planar surface 606.

Figure 6B:
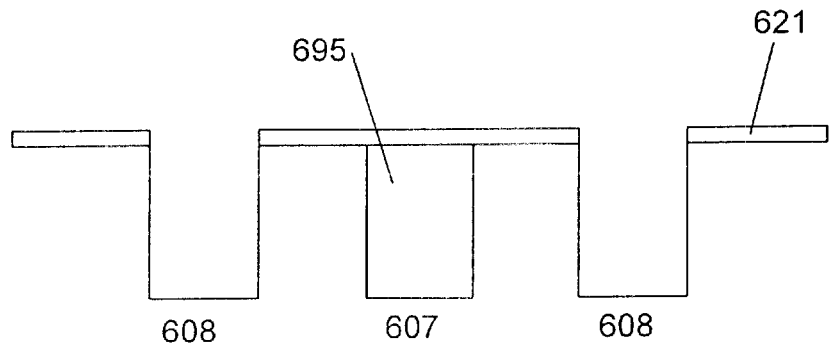

Referring to FIG. 6*b*, a mask layer is deposited on the substrate surface. The mask layer comprises, for example, nitride. Other materials that can be etched selectively to oxide are also useful. The mask is patterned to expose portions of the substrate surface corresponding to the oxide fill trenches 608 in which bitlines are to be formed while the STI regions 695 and remaining portions of the substrate are unexposed or protected by the mask. The substrate is etched by a reactive ion etch, removing the oxide from trenches 608.

In an alternative embodiment, the substrate is first prepared with STI regions. A mask layer is deposited on the substrate and patterned, exposing portions of the substrate. The substrate is etched to form trenches for the bitlines. Forming STI trenches and bitline trenches separately may be desirable to form STI and bitline trenches with different depths. In yet an another embodiment, LOCOS isolation is used. The LOCOS isolation can be formed prior to formation of the bitline trenches. Forming LOCOS isolation after the formation of the vertical transistor can also useful.

Figure 6C:
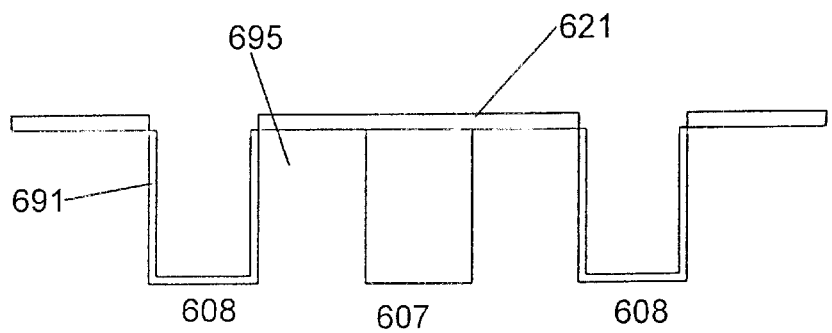
Figure 6D:
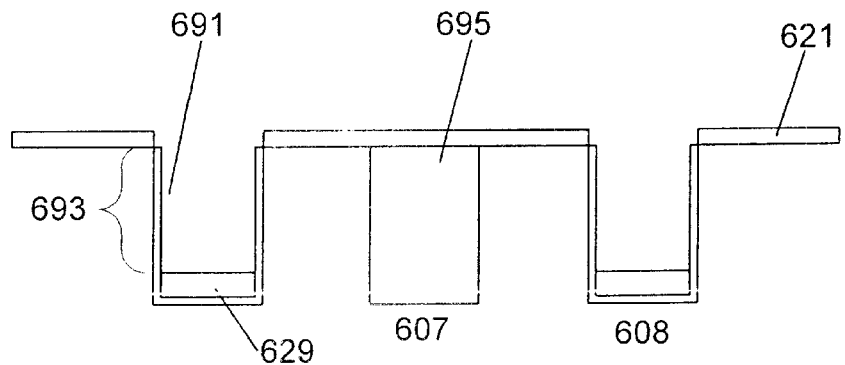

Referring to FIG. 6*c*, an oxide layer 691 is formed on the trench sidewalls and bottom. The oxide layer can be formed by thermal oxidation or deposited by CVD. In FIG. 6*d*, the oxide layer is recessed to form a collar in the bottom portion of the trench. Recessing the oxide layer can be achieved by, for example, filling the trench with a sacrificial material 629. In one embodiment, the sacrificial material comprises resist. Other types of sacrificial materials that can be removed selective to the oxide is also useful. The resist is recessed to the height of the collar, exposing portions 693 of the oxide layer. The exposed portions are removed by, for example, a wet etch selective to silicon to form the collar. After collar formation, the resist is removed from the trench.

Figure 6E:
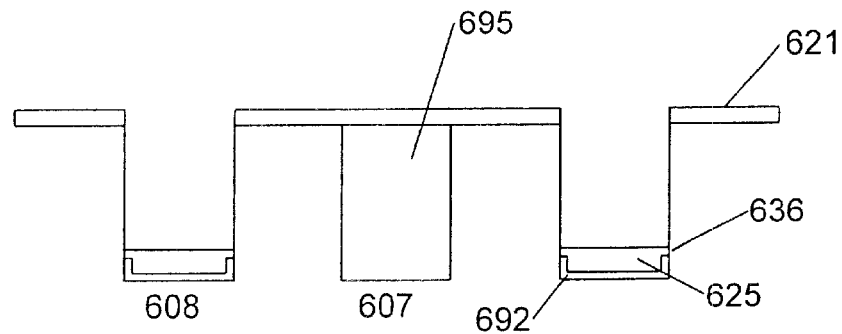

Referring to FIG. 6*e*, bitlines 625 is formed at the bottom of the trenches. In one embodiment, a doped-poly layer is deposited on the substrate to fill the trenches. The doped-poly layer comprises, for example, n-type dopants such as phosphorus (P) or arsenic (As) for n-MOS cell transistors. P-type dopants such as B can be used to adjust the gate threshold voltage of the cell transistor. The use of p-type dopants is also useful for p-MOS cell transistors. The poly layer is recessed by, for example, an REI to form bitlines at the bottom of the trenches. The top of the bitline is above the collar 692 such that a portion 636 of the poly contacts the trench sidewalls.

Figure 6F:
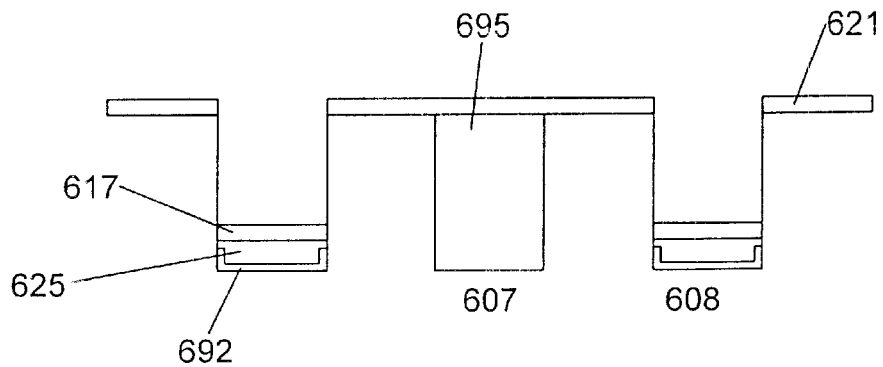

Referring to FIG. 6*f*, a dielectric layer is deposited on the substrate to fill the trenches. The dielectric layer comprises, for example, oxide. Other dielectric materials are also useful. The dielectric layer is recessed to form an insulating layer 617 above the bitline.

Figure 6G:
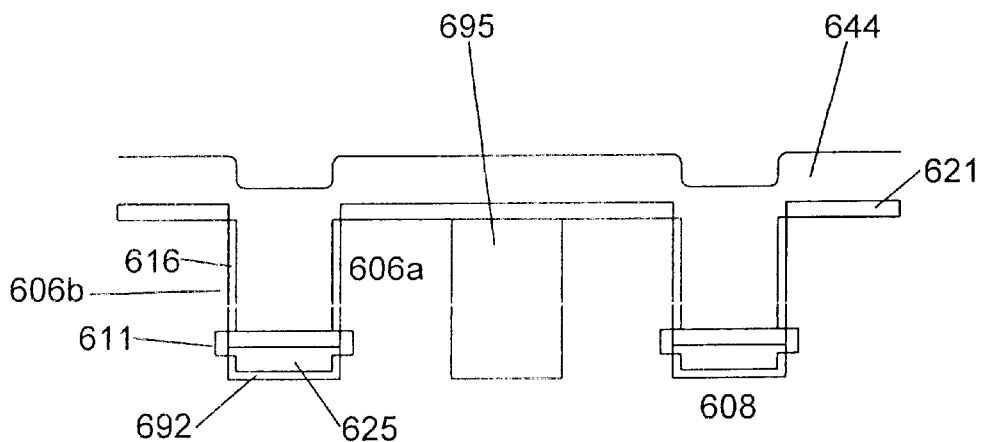

In FIG. 6*g*, the substrate is annealed, forming a thermal oxide layer 616 on the trench sidewalls 606*a*–*b*. The oxide layer serves as the gate oxide for the vertical transistors. The anneal also drives dopants from the bitlines into the substrate to form diffusion regions 611 which is used to couple the bitline to the vertical transistor. A doped poly layer 644 is deposited on the substrate, filling the trenches 608. Alternatively, the doped poly layer 644 conformally lines the trench sidewalls and bottom with a desired thickness, without filling the trenches. The thickness of the poly should be sufficient to form gate conductors.

Figure 6H:
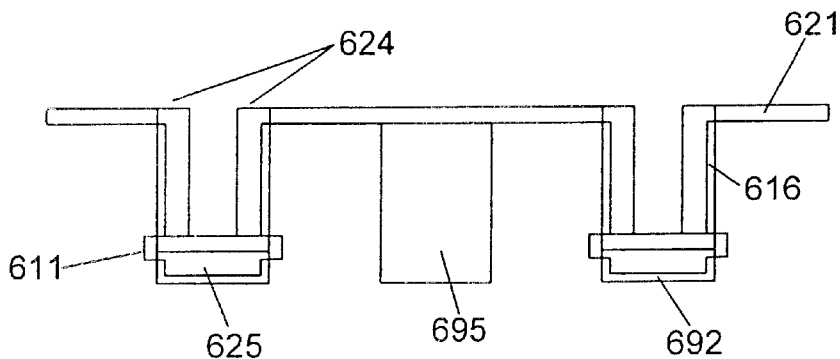

Referring to FIG. 6*h*, the poly layer is patterned by, for example, RIE to remove excess poly on the surface of the substrate and in the middle of the trench (if necessary) to form gate conductors 624 on side of the trenches. The gate conductors serve as wordlines of the array. The substrate surface is planarized by, for example, a chemical mechanical polishing (CMP). The mask layer 621 serves as a CMP stop, resulting in a planar surface between the poly and mask layer.

Figure 6I:
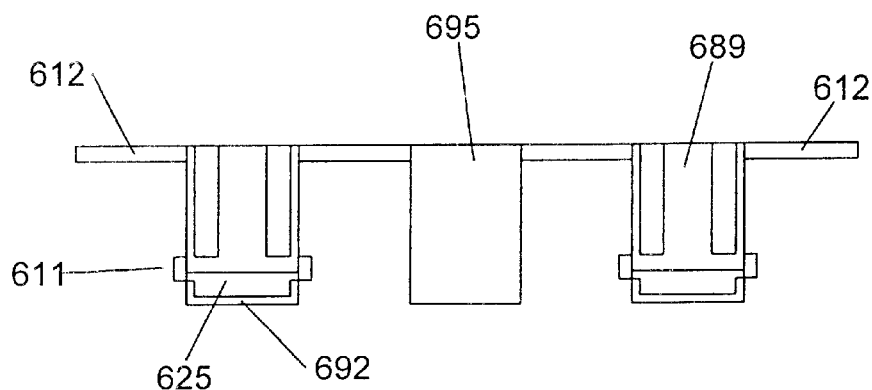

Referring to FIG. 6*i*, an oxide layer 689 is deposited on the substrate to fill the region between the gate conductors. Excess oxide is removed by, for example, CMP to form a planar top surface. In one embodiment, n-type dopants such as P or As are implanted in the substrate to form diffusion regions 612. P-type dopants can be used for p-MOS cell transistor applications. The dopants, in one embodiment, are implanted without additional masks.

Figure 6J:
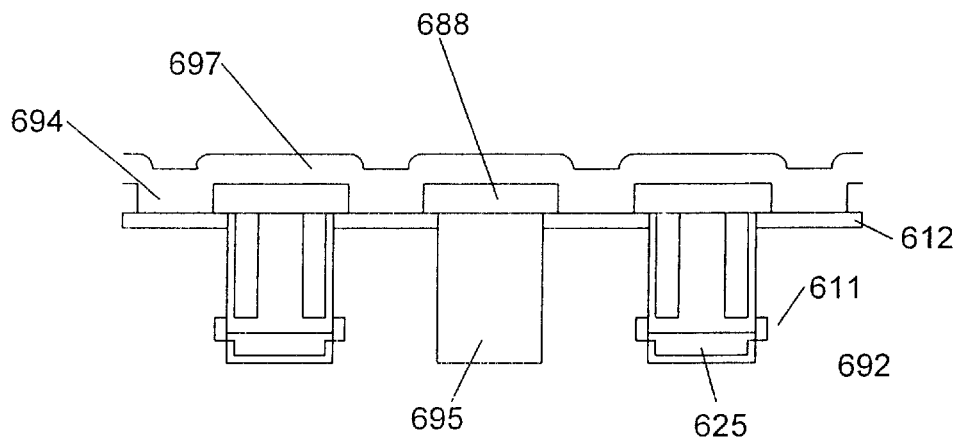
Figure 6K:
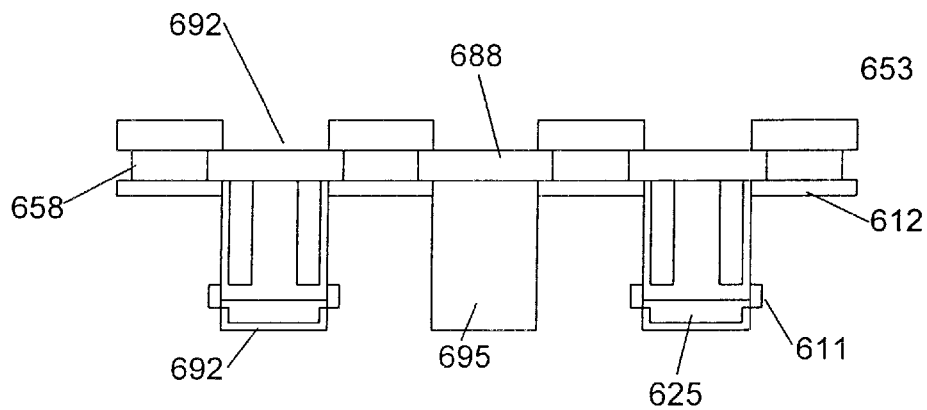
Figure 6L:
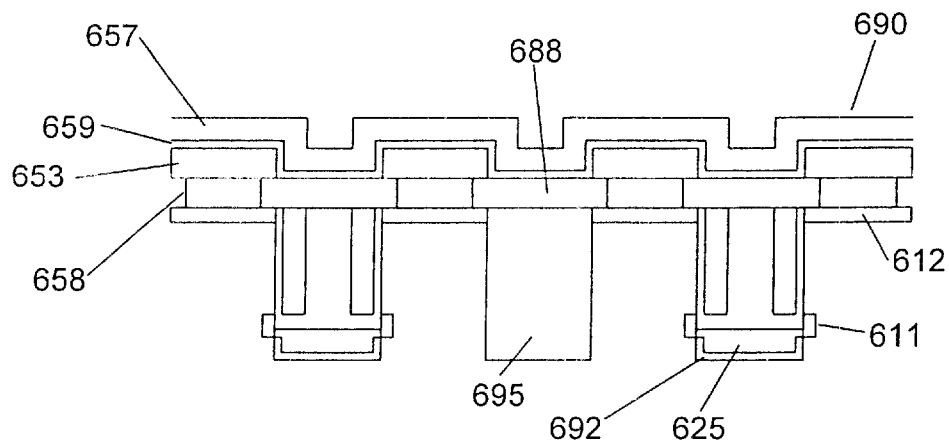

The process continues, as shown in FIGS. 6*j*–*l*, to form cell capacitors. In one embodiment, a dielectric layer is deposited on the substrate surface and patterned to provide contact openings 694 to the diffusion regions 612. A conductive layer 697 comprising, for example, doped-poly Si, tungsten, tungsten nitride, or noble metal such as Pt, Ir, IrO2, Ru, or RuO$_2$, is deposited to fill contact openings 694. Other conductive materials, such as SrRuO$_3$, (Ba,Sr)RuO$_3$, or combination of conductive layers to form a conductive stack, are also useful.

Referring to FIG. 6*k*, excess conductive material is removed by, for example, CMP, to form contacts 658. The CMP provides a planar top surface 692 between the contacts and oxide 688. A conductive layer is deposited on the substrate and patterned to form first electrodes for the cell capacitors. The conductive layer, in one embodiment, is patterned to form isolated island 653 coupled to a contacts 658.

Referring to FIG. 6*l*, a dielectric layer 659 is deposited on the substrate, covering the bottom electrodes. The dielectric layer comprises, for example, nitride-oxide stack. Other dielectric materials, such as Ta$_2$O$_5$, TiO$_2$, Al$_2$O$_3$, SrTiO$_3$, (Ba,Sr)TiO$_3$, or Pb(Zr,Ti)O$_3$, are also useful. The dielectric layer can be deposited by PVD (e.g., sputtering or evaporation) or by CVD (e.g., thermal CVD or PECVD). Other deposition techniques for forming the dielectric layer are also useful. A second conductive layer 657 is deposited on the substrate and patterned to form second electrodes for the capacitors. In one embodiment, the conductive layer is patterned to form strips in a second direction perpendicular to the word lines 624. The strips serve as platelines 690 of the array. In an alternative embodiment, non-integrated second electrode and platelines are formed. For example, the second conductive layer can be patterned to form individual second electrodes. Plate lines are then formed above and insulating layer which separates the second electrodes from the platelines. Contacts are formed in the dielectric layer coupling the second electrodes to the platelines. The process continues to complete fabrication of the IC.

In an alternative embodiment, the bitline comprises a diffusion region at the bottom of the trench instead of doped poly. In one embodiment, the bitline is formed by implanting dopants through the dielectric layer 691 lining the trench, as shown in FIG. 6*c*. The implant forms a diffusion region below the trench that serves as the bitline. In one embodiment, the bitlines of the array are coupled together to form a common bitline. Coupling of the bitlines can be achieved by diffusing the dopants from the bitline diffusion regions until they form a common diffusion region. A dielectric layer 617 is then formed above the thermal oxide in the lower portion of the trench, as described in FIG. 6f. The process of forming the cell continues as described from FIGS. 6f–l.

While the invention has been particularly shown and described with reference to various embodiments, it will be recognized by those skilled in the art that modifications and changes may be made to the present invention without departing from the spirit and scope thereof. The scope of the invention should therefore be determined not with reference to the above description but with reference to the appended claims along with their full scope of equivalents.

What is claimed is:

1. A memory cell comprising:
    a trench formed in a substrate in a first direction, the trench having first and second sidewalls and a bottom surface along the first direction;
    a bitline located on the bottom surface of the trench, the bitline being commonly coupled to bitlines of other memory cells with a memory array;
    a vertical transistor having
    a gate located in the trench along the first trench sidewall, the gate being isolated from the bitline,
        a gate oxide between the gate and the first trench sidewall,
        a first diffusion coupling the bitline to the gate,
        a second diffusion located on a surface of the substrate adjacent to the gate; and
    a capacitor located above the substrate, the capacitor comprises
    a first electrode coupled to the second diffusion region by a contact,
    a second electrode,
    a dielectric layer separating the first and second electrodes,
    a plateline coupled to the second electrode, wherein data is written to or read from the memory cell through the plateline.

2. The memory cell of claim 1 wherein the bitline comprises a doped-polysilicon layer formed in the bottom of the trench.

3. The memory cell of claim 1 wherein the bitline comprises a diffusion region in contact with the bottom of the trench.

4. The memory cell of claim 1 wherein the gate forms a wordline, the wordline is in the first direction.

5. The memory cell of claim 4 wherein the plateline is in a second direction, and the first direction is perpendicular to the second direction.

6. The memory cell of claim 5 wherein the bitlines of the array are coupled together to form a common bitline.

7. The memory cell of claim 5 further comprises an isolation region adjacent to the second diffusion region.

8. The memory cell of claim 5 comprises a surface area equal to about 4F$^2$, where F is the feature size.

9. The memory cell of claim 4 further comprises an isolation region adjacent to the second diffusion region.

10. The memory cell of claim 9 wherein the wordline is perpendicular to the plateline.

11. The memory cell of claim 9 wherein the bitlines of the array are coupled together to form a common bitline.

12. The memory cell of claim 9 comprises a surface area equal to about 4F$^2$, where F is the feature size.

13. The memory cell of claim 4 wherein the bitlines of the array are coupled together to form a common bitline.

14. The memory cell of claim 13 further comprises an isolation region adjacent to the second diffusion region.

15. The memory cell of claim 13 wherein the wordline is perpendicular to the plateline.

16. The memory cell of claim 13 comprises a surface area equal to about 4F$^2$, where F is the feature size.

17. The memory cell of claim 4 comprises a surface area equal to about 4F$^2$, where F is the feature size.

18. The memory cell of claim 17 further comprises an isolation region adjacent to the second diffusion region.

19. The memory cell of claim 17 wherein the wordline is perpendicular to the plateline.

20. The memory cell of claim 17 wherein the bitlines of the array are coupled together to form a common bitline.

21. A memory cell comprising:
    a trench formed in a substrate in a first direction having first and second sidewalls and a bottom surface along the first direction;
    a bitline comprising a doped-polysilicon layer located on the bottom surface of the trench;
    a vertical transistor having
        a gate located in the trench along the first trench sidewall, the gate being isolated from the bitline,
        a gate oxide between the gate and the first trench sidewall,
        a first diffusion coupling the bitline to the gate,
        a second diffusion located on a surface of the substrate adjacent to the gate;
    a capacitor located above the substrate, the capacitor comprises
        a first electrode coupled to the second diffusion region by a contact,
        a second electrode coupled to a plateline for sensing information in the capacitor, and
        an isolation collar lining a bottom portion of the trench, the isolation collar isolating the bitline from the substrate except in a portion where the diffusion region couples the bitline to the transistor.

22. A memory cell comprising:
    a trench formed in a substrate in a fist direction having first and second sidewalls and a bottom surface along the first direction;
    a bitline located on the bottom surface of the trench;
    a vertical transistor having
        a gate located in the trench along the first trench sidewall, the gate isolated from the bitline, the gate forms a gate conductor along the first direction,
        a gate oxide between the gate and the first trench sidewall,
        a first diffusion coupling the bitline to the gate,
        a second diffusion located on a surface of the substrate adjacent to the gate;
    a capacitor located above the substrate, the capacitor comprises
    a first electrode coupled to the second diffusion region by a contact,
    a second electrode is part of a plateline for sensing information in the capacitor, the plateline is in a second direction.

23. The memory cell of claim 22 further comprises an isolation region adjacent to the second diffusion region.

24. The memory cell of claim 22 wherein the second direction is perpendicular to the first direction.

25. The memory cell of claim 24 further comprises an isolation region adjacent to the second diffusion region.

26. The memory cell of claim 24 wherein the bitlines of the array are coupled together to form a common bitline.

27. The memory cell of claim 24 comprises a surface area equal to about $4F^2$, where F is the feature size.

28. The memory cell of claim 22 wherein the bitline is coupled to other bitlines of a memory array.

29. The memory cell of claim 22 comprises a surface area equal to about $4F^2$, where F is the feature size.

* * * * *